(12) United States Patent
Park et al.

(10) Patent No.: US 7,733,432 B2
(45) Date of Patent: Jun. 8, 2010

(54) LIQUID CRYSTAL DISPLAY AND METHOD OF FABRICATING THE SAME

(75) Inventors: Hyun Park, Cheonan-si (KR); In-Ho Park, Cheonan-si (KR); Seong-Young Lee, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 344 days.

(21) Appl. No.: 11/869,469

(22) Filed: Oct. 9, 2007

(65) Prior Publication Data

US 2008/0084514 A1    Apr. 10, 2008

(30) Foreign Application Priority Data

Oct. 10, 2006    (KR) ...................... 10-2006-0098568

(51) Int. Cl.
*G02F 1/1343* (2006.01)

(52) U.S. Cl. ........................... 349/39; 349/38; 349/129; 349/138

(58) Field of Classification Search ................... 349/38, 349/39, 129
See application file for complete search history.

(56) References Cited

U.S. PATENT DOCUMENTS

| 7,359,025 B2 * | 4/2008 | Wu et al. ..................... 349/139 |
| 2003/0202146 A1 * | 10/2003 | Takeda et al. ............... 349/129 |

* cited by examiner

*Primary Examiner*—Richard H Kim
(74) *Attorney, Agent, or Firm*—H.C. Park & Associates, PLC

(57) ABSTRACT

A liquid crystal display including the first and second substrates facing each other and a liquid crystal layer interposed between the first and second substrates is provided. A storage electrode, a transparent insulating layer pattern, and a pixel electrode are formed on the first substrate. A common electrode having a domain divider is formed on the second substrate. The transparent insulating layer pattern includes an opening having a first area having a first width and a second area having a second width narrower than the first width. The domain divider partially overlaps the storage electrode in the second area of the opening of the transparent insulating layer pattern.

14 Claims, 18 Drawing Sheets

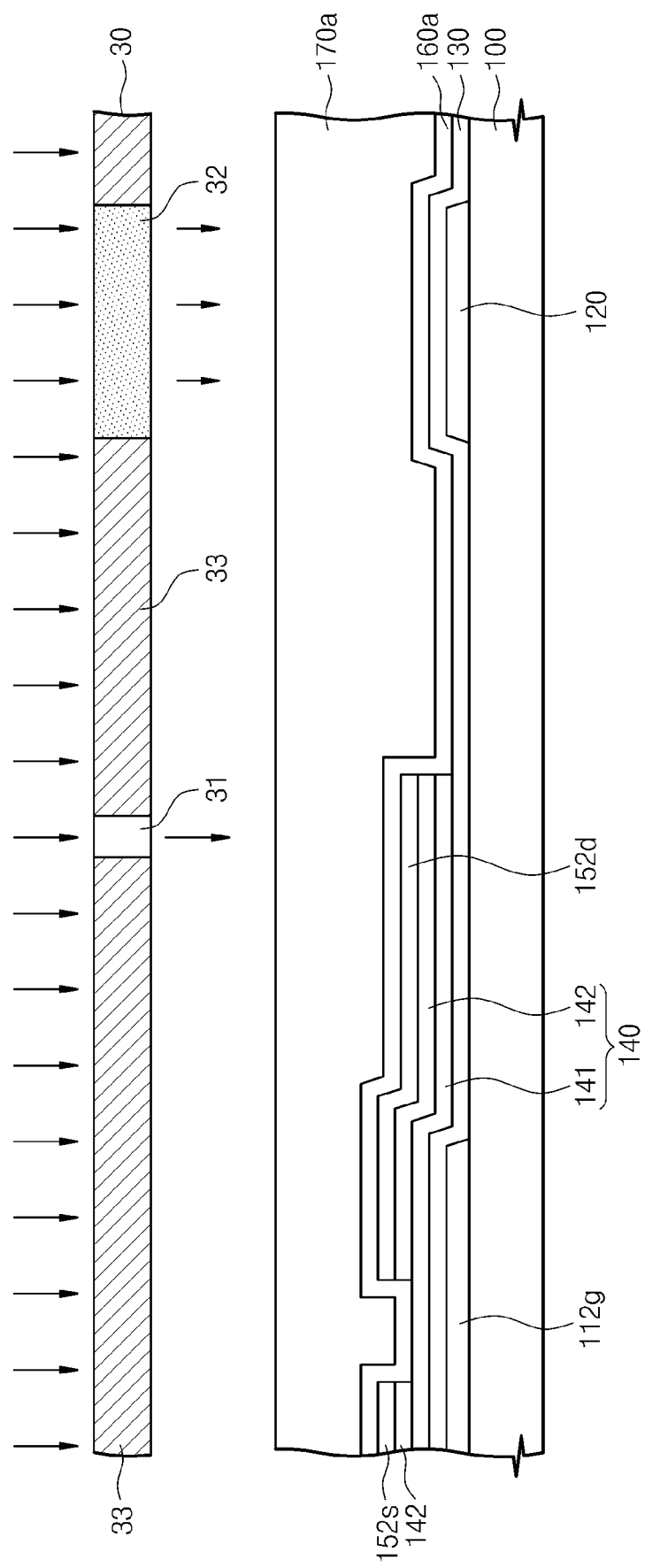

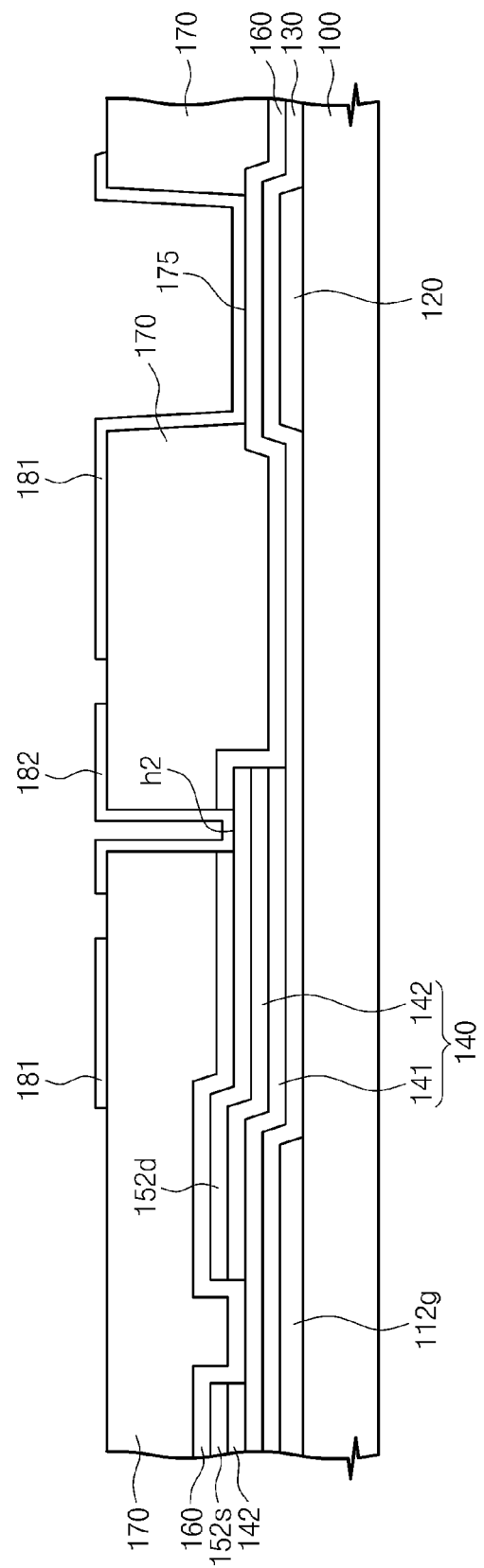

LIQUID CRYSTAL DISPLAY AND METHOD OF FABRICATING THE SAME

CROSS-REFERENCE TO RELATED APPLICATION

This application claims priority from and the benefit of Korean Patent Application No. 10-2006-0098568, filed on Oct. 10, 2006, which is hereby incorporated by reference for all purposes as if fully set forth herein.

BACKGROUND OF THE INVENTION

1. Field of the Invention

The present invention relates to a display apparatus. More particularly, the present invention relates to a liquid crystal display using liquid crystals.

2. Discussion of the Background

A liquid crystal display uses liquid crystals having a mesomorphic phase representing both liquid and crystal properties. The liquid crystal display is provided with two substrates, and a liquid crystal layer, where liquid crystals are aligned, is interposed between the two substrates.

When an electric field is applied to the liquid crystals, alignment directions of the liquid crystals may be changed, and the light transmittance of the liquid crystals may be changed according to the alignment directions of the liquid crystals. Accordingly, the liquid crystal display may display an image corresponding to the adjusted light transmittance.

In most display apparatuses, the quality of an image when viewed in a direction perpendicular to a front surface of the display apparatus is superior to that of the image when viewed in a lateral direction of the display apparatus. A viewing angle is the range in which a user may properly view a displayed image, and a liquid crystal display generally has a narrower viewing angle than other display apparatuses. This is because the light transmittance may be changed according to the alignment directions of liquid crystals. That is, the image may be distorted when the user views the image from a lateral side of the liquid crystal display, such that the image quality is degraded.

SUMMARY OF THE INVENTION

The present invention provides a liquid crystal display that may be capable of displaying a high quality image while widening a viewing angle.

The present invention also provides a method of fabricating the liquid crystal display.

Additional features of the invention will be set forth in the description which follows, and in part will be apparent from the description, or may be learned by practice of the invention.

The present invention discloses a liquid crystal display including a first substrate, a second substrate, a liquid crystal layer, a storage electrode, a first transparent insulating layer pattern, a pixel electrode, and a common electrode. The first substrate has a pixel area defined thereon. The second substrate faces the first substrate. The liquid crystal layer is interposed between the first substrate and the second substrate. The storage electrode is disposed on the first substrate. The first transparent insulating layer pattern is disposed on the storage electrode and includes an opening having a first area having a first width and a second area having a second width narrower than the first width. The pixel electrode is disposed on the first transparent insulating layer pattern. The common electrode is disposed on the second substrate and has a domain divider that divides the pixel area into a plurality of domains. The domain divider partially overlaps the storage electrode in the second area of the opening in the first transparent insulating layer pattern.

The present invention also discloses a method of manufacturing a liquid crystal display including forming a gate electrode and a storage electrode, which are spaced apart from each other, on a first substrate. A semiconductor layer pattern is formed on the gate electrode such that the semiconductor layer pattern overlaps the gate electrode. A source electrode and a drain electrode, which are spaced apart from each other, are formed on the semiconductor layer pattern. A first transparent insulating layer is formed on the source electrode and the drain electrode. A first transparent insulating layer pattern is formed by patterning the first transparent insulating layer. The first transparent insulating layer pattern includes an opening having a first area having a first width and a second area having a second width narrower than the first width. A pixel electrode is formed on the first transparent insulating layer pattern. A common electrode having a domain divider, which divides a pixel area into a plurality of domains, is formed on a second substrate. A liquid crystal layer is formed between the first and second substrates and the first substrate is coupled with the second substrate such that the first substrate faces the second substrates. The domain divider partially overlaps the storage electrode, and the opening in the first transparent insulating layer pattern has the second width in the area where the domain divider overlaps the storage electrode.

It is to be understood that both the foregoing and general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 11A, FIG. 11B, FIG. 11C, FIG. 11D, FIG. 11E, FIG. 11F, FIG. 11G, FIG. 11H, and FIG. 11I are sectional views showing a method of manufacturing a liquid crystal display according to an exemplary embodiment of the present invention.

DETAILED DESCRIPTION OF THE ILLUSTRATED EMBODIMENTS

Figure 1:
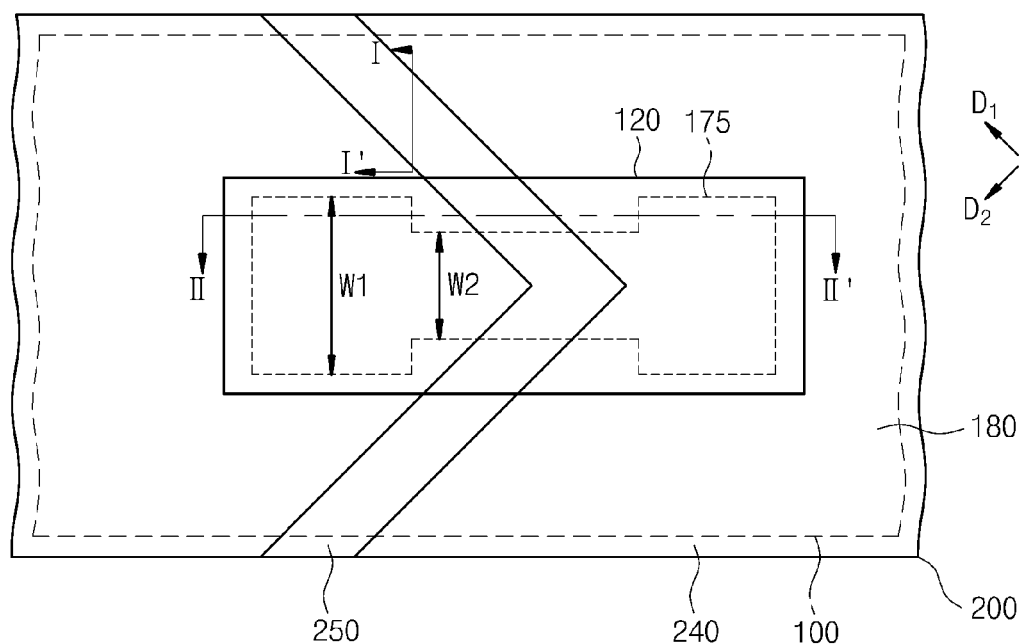
FIG. 1 is a plan view showing a liquid crystal display according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a plan view showing a liquid crystal display according to a first exemplary embodiment of the present invention.

Referring to FIG. 1, a first substrate 100 and a second substrate 200, which face each other, are provided. The first substrate 100 has a plurality of pixel areas defined thereon. The pixel areas are basic elements that form an image. All of the pixel areas have the same structure, and a portion of one selected from among the pixel areas is shown in FIG. 1.

A storage electrode 120 may be formed on the first substrate 100, and a pixel electrode 180 may be formed on the storage electrode 120. The pixel electrode 180 may have a shape corresponding to the pixel area and may be separately disposed in the pixel area. A common electrode 240 may be formed on the second substrate 200 corresponding to the pixel electrode 180. The common electrode 240 may be integrally formed instead of being divided according to the pixel areas. In the operation of the liquid crystal display, voltages may be applied to the pixel electrode 180 and the common electrode 240, respectively.

The common electrode 240 may include a domain divider 250. The domain divider 250 may be inclined with respect to a row direction and may extend in first and second directions $D_1$ and $D_2$ symmetrical to each other. A portion of the domain divider 250 extending in the first direction $D_1$ may meet with a portion of the domain divider 250 extending in the second direction $D_2$, and the domain divider 250 may be bent in the meeting area. The portion of the domain divider 250 extending in the first direction $D_1$ and the portion of the domain divider 250 extending in the second direction $D_2$ may be inclined at ±45° about the row direction.

Figure 2A:
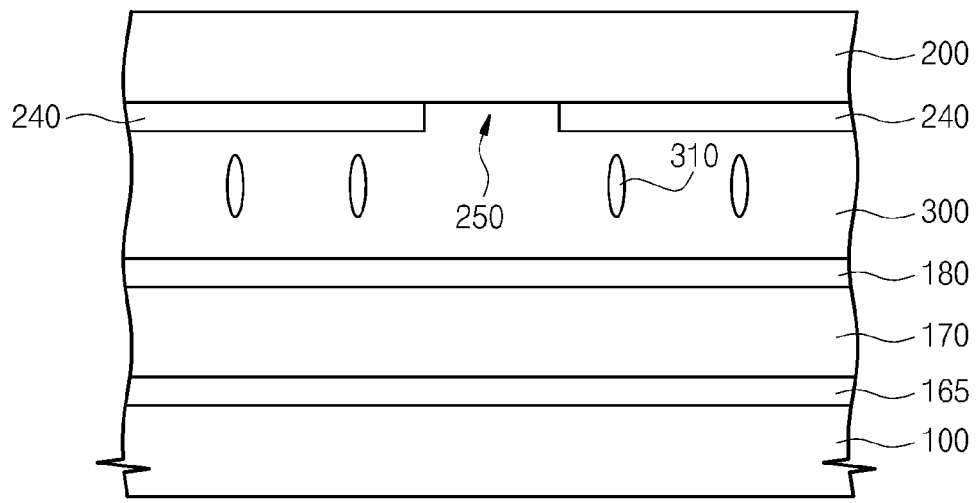
FIG. 2A and FIG. 2B are sectional views taken along line I-I' of FIG. 1 that show an operational process of a liquid crystal display.
Figure 2B:
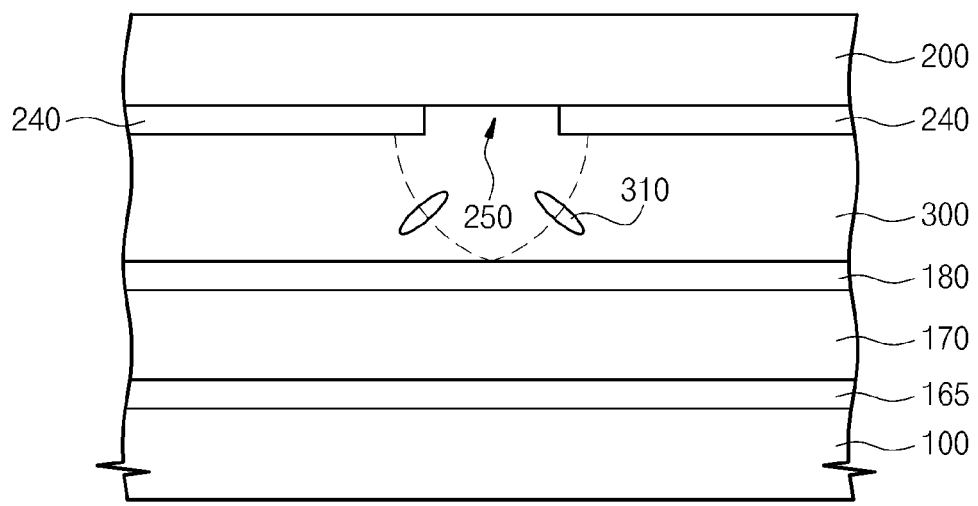

FIG. 2A and FIG. 2B are sectional views taken along line I-I' of FIG. 1 showing an operational process of the liquid crystal display.

Referring to FIG. 2A, a liquid crystal layer 300 is interposed between the first and second substrates 100 and 200. Transparent insulating layer patterns 165 and 170 are formed between the first substrate 100 and the pixel electrode 180. The first transparent insulating layer pattern 170 may be provided on the second transparent insulating layer pattern 165. The first and second transparent insulating layer patterns 170 and 165 may include organic and inorganic materials, respectively. The first transparent insulating layer pattern 170 may be thicker than the second transparent insulating layer pattern 165. The common electrode 240, which is on the second substrate 200, may have a cutting pattern formed by removing a portion of the common electrode 240, and the domain divider 250 may be defined by the cutting pattern.

The liquid crystal layer 300 may have liquid crystals 310 aligned therein. The liquid crystals 310 may have an oval shape including a long axis and a short axis. The alignment direction of the liquid crystals 310 is defined as the long-axis direction. When voltages are not applied to the pixel electrode 180 and the common electrode 240 during the operation of the liquid crystal display, the liquid crystals 310 may be aligned perpendicularly to the first and second substrates 100 and 200. Light may be provided to the liquid crystal layer 300. In this alignment state, the light passes through the liquid crystal layer 300 without a phase variation. Polarizing plates (not shown), which have absorption axes perpendicular to each other, may be attached to outer portions of the first and second substrates 100 and 200. Accordingly, since the light is linearly polarized while passing through the polarizing plate attached to the outer portion of the first substrate 100 and then absorbed by the polarizing plate attached to the outer portion of the second substrate 200, the liquid crystal display apparatus may be in a black state.

Referring to FIG. 2B, a data voltage corresponding to an image to be displayed may be applied to the pixel electrode 180 during the operation of the liquid crystal display. In addition, a constant common voltage may be applied to the common electrode 240. An electric field may be generated between the first and second substrates 100 and 200 due to the potential difference between the data voltage and the common voltage. The liquid crystals 310 have an anisotropic dielectric constant and tilt with respect to the first and second substrates 100 and 200 according to the electric field.

In this alignment state, the light provided to the liquid crystal layer 300 may be subject to a phase variation according to the alignment of the liquid crystals 310 while passing through the liquid crystals 310. The value of the phase variation of the light may change according to the tilting degree of the liquid crystals 310. In addition, the tilting degree of the liquid crystals 310 may be determined according to the intensity of the electric field. Since the light linearly polarized by passing through the polarizing plate that is attached to the outer portion of the first substrate 100 is subject to phase variation while passing through the liquid crystals 310, the light may be output through the polarizing plate attached to the outer portion of the second substrate 200. Accordingly, an image having predetermined gray scales may be displayed by the output light.

In the above operation, the common voltage is not applied to the domain divider 250 provided with the cutting pattern. The intensity or the direction of the electric field may be changed by the domain divider 250.

As shown by the dotted line of FIG. 2B, the electric field may be formed to have a curve shape extending from an end portion of the domain divider 250. The electric field may be symmetrically formed about the domain divider 250. The liquid crystals 310 may have different alignment directions at both sides of the domain divider 250 while being aligned perpendicularly to the direction of the electric field.

The pixel areas may be divided according to the alignment directions of the liquid crystals 310 and the divided pixel areas are referred to as domains. In this case, each pixel area may be divided into a plurality of domains by the domain divider 250. The liquid crystals 310 may be aligned in various directions in the domains, so that the viewing angle of the liquid crystal display may be widened.

Figure 3:
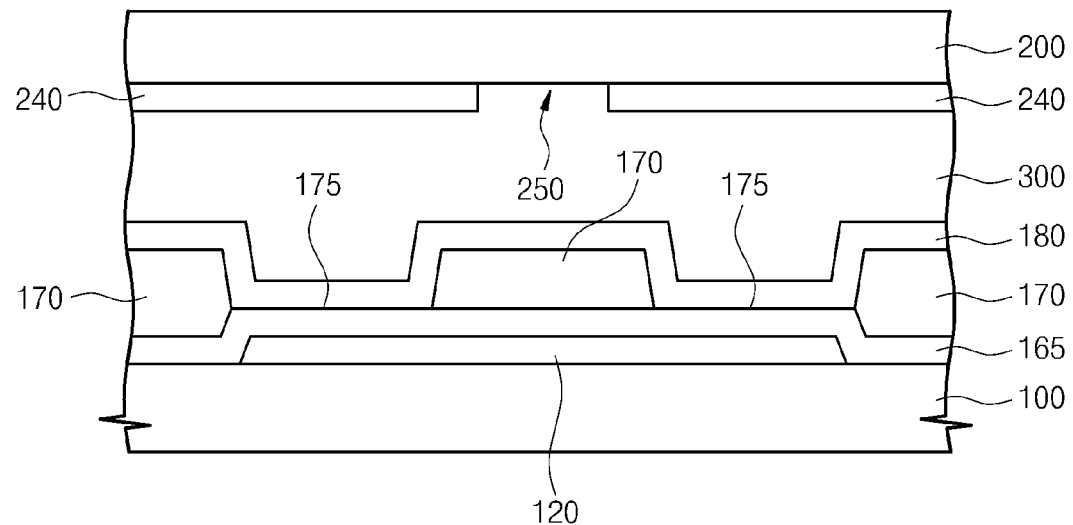
FIG. 3 is a sectional view taken along line II-II' of FIG. 1.

FIG. 3 is a sectional view taken along line II-II' of FIG. 1.

Referring to FIG. 3, the storage electrode 120 may be formed on the first substrate 100. The second transparent insulating layer pattern 165 may be formed on the storage electrode 120 to cover the storage electrode 120. The first transparent insulating layer pattern 170 may partially cover the storage electrode 120. A storage capacitor is formed by the storage electrode 120, the first and second transparent insulating layer patterns 165 and 170, and the pixel electrode 180.

The storage capacitor may maintain the data voltage applied to the liquid crystal layer 300 during a predetermined time interval. The maintenance time interval increases as the capacity of the storage capacitor increases. The capacity of the storage capacitor increases as the distance between the storage electrode 120 and the pixel electrode 180 decreases. Accordingly, the first transparent insulating layer pattern 170 may be partially opened to define an opening 175 above the storage electrode 120, and the capacity of the storage capacitor may increase by the thickness of the first transparent insulating layer pattern 170.

However, as shown by the dotted line inside the storage electrode 120 of FIG. 1, the first transparent insulating layer pattern 170 may include an opening 175 having a varying width. In detail, the opening 175 in the first transparent insulating layer pattern 170 may have a first width W1 corresponding to the storage electrode 120 and a second width W2 narrower than the first width W1 corresponding to the area where the storage electrode 120 overlaps the domain divider 250, such that the storage electrode 120 is covered.

Accordingly, the vertical distance between the storage electrode 120 and the pixel electrode 180 increases and the distance between the pixel electrode 180 and the common electrode 240 decreases in the area where the opening 175 has the second width W2. The vertical distance between the pixel electrode 180 and the domain divider 250 decreases and the vertical distance between the pixel electrode 180 and the common electrode 240 increases in the area wherein the opening 175 has the first width W1.

Since the domain divider 250 may be used to change the electric field applied to the liquid crystal layer 300, the electric field may be distorted as the distance between the domain divider 250 and the pixel electrode 180 increases.

If the electric field is distorted, the domain divider 250 may be unable to control the alignment direction of the liquid crystals 310 and therefore, the alignment of the liquid crystals 310 may be scattered in a corresponding area. To prevent this scattering, the opening 175 may be narrowed in the area where the domain divider 250 overlaps the storage electrode 120, thereby reducing the distance between the pixel electrode 180 and the domain divider 250. In addition, the distance between the storage electrode 120 and the pixel electrode 180 may be reduced by widening the opening 175 in the area where the domain divider 250 is not formed, so that the capacity of the storage capacitor may be increased.

Figure 4:
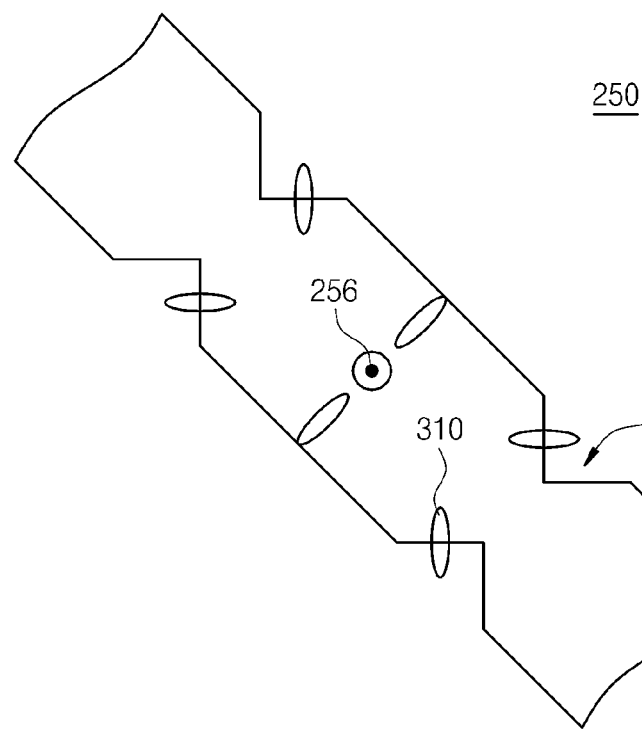
FIG. 4 is a view showing a domain divider of FIG. 1 having a notch to adjust an alignment of liquid crystals.

FIG. 4 is a view showing a domain divider of FIG. 1 having a notch to adjust the alignment of liquid crystals.

Referring to FIG. 4, the domain divider 250 may have at least one notch 255. The notch 255 may be a recess formed by removing a portion of the domain divider 250. Alternatively, the notch 255 may be a protrusion on the domain divider 250. As described above, the liquid crystals 310 may be aligned symmetrically to each other at both sides of the domain divider 250. However, since there is no unit to adjust the alignment direction of the liquid crystals 310 in an area where the domain divider 250 is formed, the alignment of the liquid crystals 310 in that area may be scattered.

The notch 255 may be used to prevent the alignment of the liquid crystals 310 in the area where the domain divider 250 is formed from being scattered. As shown in FIG. 4, the liquid crystals 310 are perpendicular to a surface of the notch 255 when viewed in a plan view. The alignment directions of the liquid crystals 310 derived from neighboring notches 255 are symmetrical to each other. A singular point 256 is formed at a middle point between neighboring notches 255, in which the liquid crystals 310 are aligned symmetrically to each other about the singular point 256.

The position of the singular point 256 may be adjusted such that the liquid crystals 310 are not arbitrarily aligned in the domain divider 250. To this end, the notch 255 may be formed at a preset position, and the singular point 256 may be positioned at the middle point between substantially neighboring notches 255.

Figure 5:
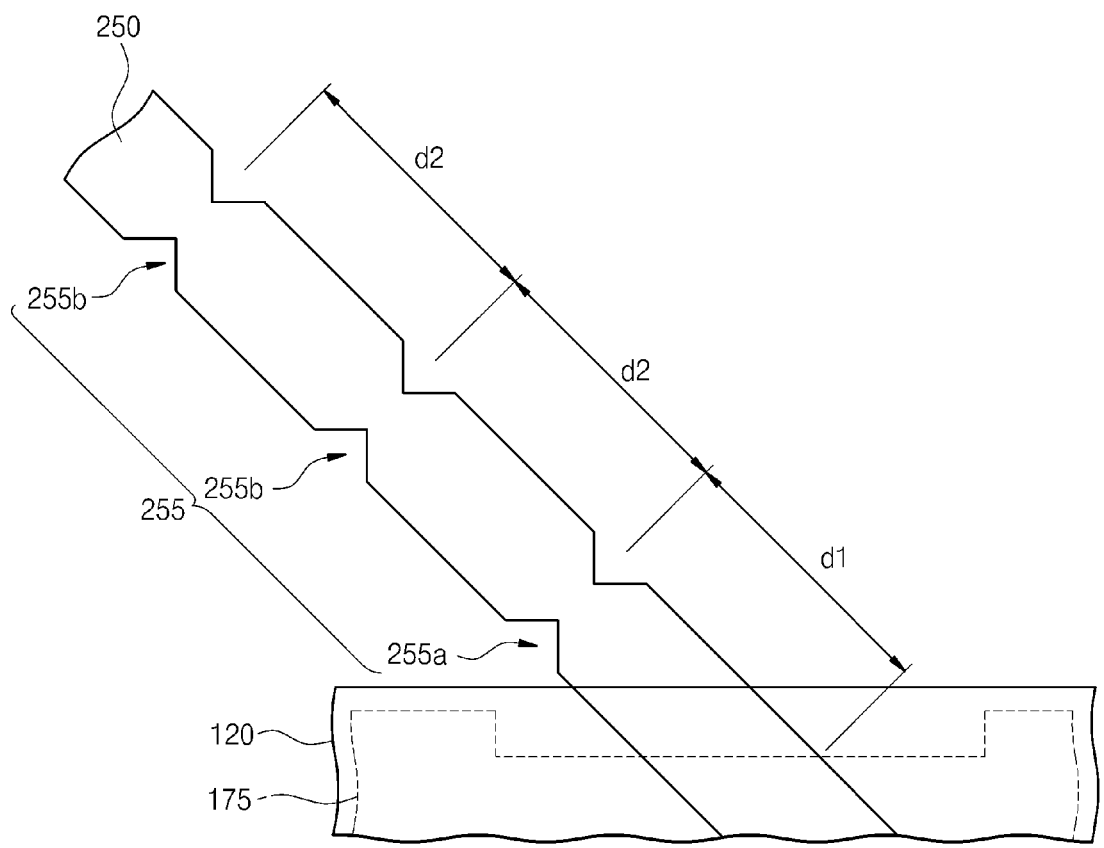
FIG. 5 is an enlarged view showing an area where the storage electrode overlaps the domain divider shown in FIG. 1.

FIG. 5 is an enlarged view showing the area where the storage electrode overlaps the domain divider shown in FIG. 1.

Referring to FIG. 5, the domain divider 250 includes a plurality of notches 255 formed from the end portion of the storage electrode 120. For the purpose of explanation, two types of notches 255 will be described below. The notch 255 nearest to the storage electrode 120 is referred to as the first notch 255a and the remaining notches 255 are referred to as the second notches 255b. The same interval may be formed between adjacent notches 255b, that is, the adjacent notches 255b may be spaced apart from each other by a second distance d2 in the direction of extending the domain divider 250.

The first notch 255a may be spaced apart from the second notch 255b adjacent to the first notch 255a by the second distance d2. The distance to the first notch 255a from an end portion of the first transparent insulating layer pattern 170, in which the opening 175 is defined, is the first distance d1. The first distance d1 may be lengthened as the second width W2 of the opening 175 of the first transparent insulating layer pattern 170 is narrowed.

As described above, the first transparent insulating layer pattern 170 has a step difference in an area corresponding to the opening 175. The control of the domain divider 250 over the liquid crystals 310 may be weakened in the above area. This is because the liquid crystals 310 may be inclined with respect to the first substrate 100 along the surface of the above area, so the liquid crystals 310 may be aligned in a direction different from a direction controlled by the domain divider 250. In addition, the vertical distance to the pixel electrode 180 from the domain divider 250 in the above area is increased, so the electric field applied to the liquid crystals 310 may be distorted. Accordingly, the control of the domain divider 250 over the liquid crystals 310 may be weakened.

Accordingly, in order to form the singular point 256 at a desired position by controlling the liquid crystals 310 using the notches 255, the first distance d1 should be long enough that the first notch 255a is sufficiently spaced apart from the area in which the control of the domain divider 250 over the liquid crystals 310 is weakened. In detail, the first distance d1 may be at least 20 μm. In the present exemplary embodiment, in order to ensure that the first distance d1 is long enough to control the liquid crystals 310, the width of the first transparent insulating layer pattern 170 may be reduced in the area where the domain divider 250 overlaps the storage electrode 120.

The first distance d1 may be identical to the second distance d2. In this case, the notches 255 are spaced apart from the end portion of the first transparent insulating layer pattern 170, in which the opening 175 is defined, at a predetermined interval. Thus, the area in which the domain divider 250 is formed may be divided at the same interval, except for in the area where the opening 175 in the first transparent insulating layer pattern 170 is formed. Accordingly, the singular points may be formed at desired positions with a predetermined interval, so that a high-quality image may be displayed.

Figure 6:
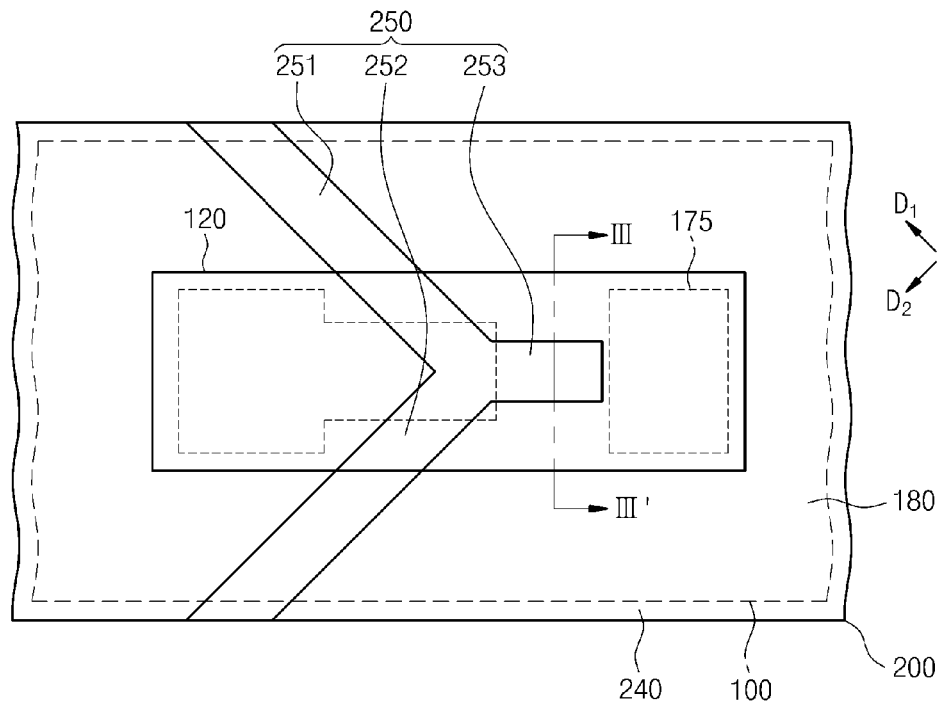
FIG. 6 is a plan view showing a liquid crystal display according to a second exemplary embodiment of the present invention.
Figure 7:
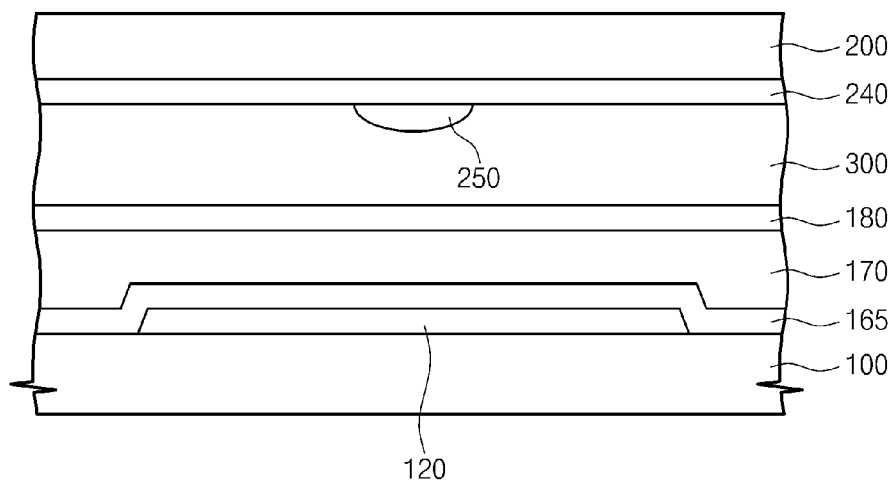
FIG. 7 is a sectional view taken along line III-III' of FIG. 6.

FIG. 6 is a plan view showing a liquid crystal display according to a second exemplary embodiment of the present invention, and FIG. 7 is a sectional view taken along a line III-III' of FIG. 6.

In the present exemplary embodiment, the same reference numerals are assigned to the same elements as those in the first exemplary embodiment, and detailed descriptions thereof will be omitted below.

Referring to FIG. 6 and FIG. 7, a first substrate 100 and a second substrate 200 facing each other are provided. A plurality of pixel areas, each having the same structure, is defined on the first substrate 100. FIG. 6 and FIG. 7 show a portion of one selected from among the pixel areas.

The first substrate 100 is provided with a storage electrode 120, first and second transparent insulating layer patterns 170 and 165, and a pixel electrode 180. The second transparent insulating layer pattern 165 covers the storage electrode 120. The first transparent insulating layer pattern 170 has an opening 175 in a predetermined area of the storage electrode 120 and partially covers the storage electrode 120.

The common electrode 240 having the domain divider 250 is formed on the second substrate 200. The domain divider 250 may be inclined with respect to the row direction of the pixel areas and may extend in first and second directions $D_1$ and $D_2$ symmetrical to each other. A portion of the domain divider 250 extending in the first direction $D_1$ may meet with a portion of the domain divider 250 extending in the second direction $D_2$ on the storage electrode 120. The domain divider 250 may also include a portion extending in the row direction in the meeting area.

Hereinafter, in the domain divider 250, the portion extending in the first direction $D_1$, the portion extending in the second direction $D_2$, and the portion extending in the row direction are referred to as the first portion 251, the second portion 252, and the third portion 253, respectively. In the meeting area of the first and second portions 251 and 252, the liquid crystals may be aligned perpendicularly to the first portion 251 or the second portion 252 under the influence of the first and second portions 251 and 252. As described above, if the liquid crystals 310 are under the influence of the first and second portions 251 and 252, the alignment of the liquid crystals 310 may be scattered. The third portion 253 may prevent the alignment of the liquid crystals 310 from being scattered in the meeting area of the first and second portions 251 and 252.

As shown in FIG. 6 and FIG. 7, the first transparent insulating layer pattern 170 includes the dual width opening 175. The opening 175 is not formed where the first transparent insulation layer pattern 170 covers the third portion 253. As described above, if the opening 175 in the first transparent insulating layer pattern 170 is disposed in the area where the domain divider 250 is formed, the control of the domain divider 250 over the liquid crystals 310 may be weakened. Accordingly, in order to prevent the control of the domain divider 250 from weakening, the opening 175 in the first transparent insulating layer pattern 170 is not formed in an area corresponding to the third portion 253 of the domain divider 250.

The domain divider 250 may include a protrusion on the common electrode 240. The protrusion may include an insulating material and therefore, a common voltage may not be applied to the area of the protrusion. The protrusion may change the intensity or the direction of an electric field formed between the common electrode 240 and the pixel electrode 180. Accordingly, the protrusion may serve the same role as the as a cutting pattern of the common electrode 240 in the first exemplary embodiment. The third portion 253 may also be formed by the cutting pattern.

Figure 8:
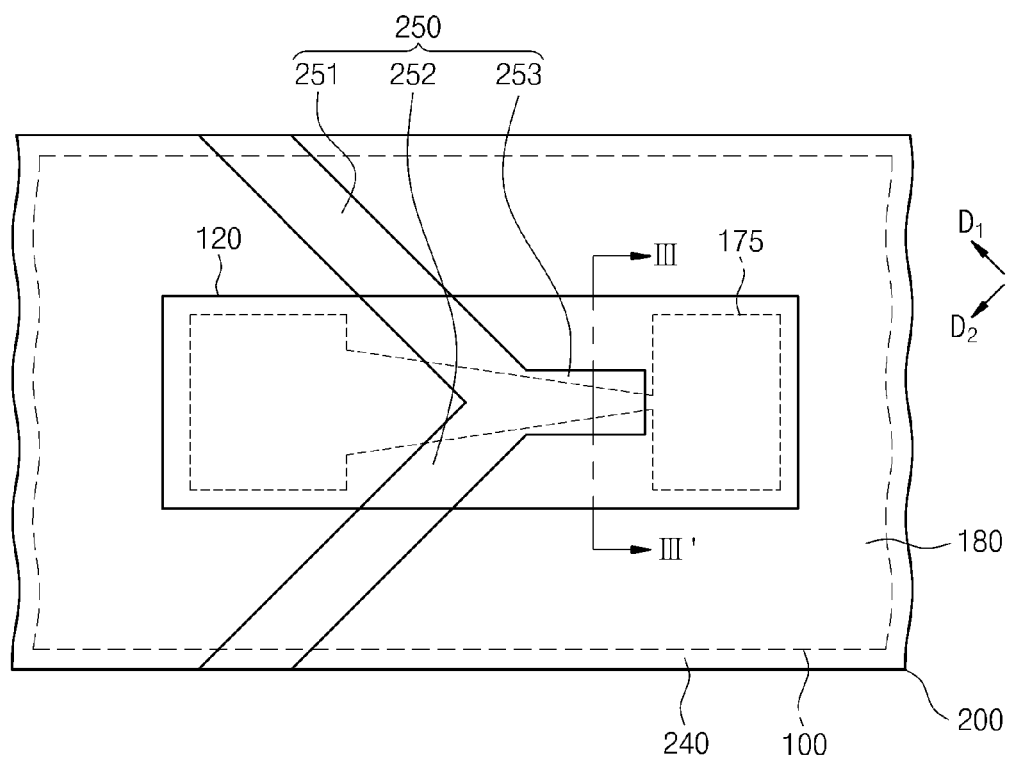
FIG. 8 is a plan view showing a liquid crystal display according to a third exemplary embodiment of the present invention.

FIG. 8 is a plan view showing a liquid crystal display according to a third exemplary embodiment of the present invention.

In the present exemplary embodiment, the same reference numerals are assigned to the same elements as those in the first and second exemplary embodiments, and detailed descriptions thereof will be omitted below.

Referring to FIG. 8, a first substrate 100 and a second substrate 200 facing each other are provided. The first substrate 100 is provided with a storage electrode 120 and a pixel electrode 180. The second substrate 200 is provided with a common electrode 240. The common electrode 240 includes a domain divider 250.

An insulating layer (not shown) is formed between the storage electrode 120 and the pixel electrode 180. The insulating layer has an opening 175. The opening may be divided into a portion having a uniform width and a portion having an irregular width narrower than the uniform width. The portion having the narrower width may correspond to the area where the domain divider 250 is bent.

Figure 9:
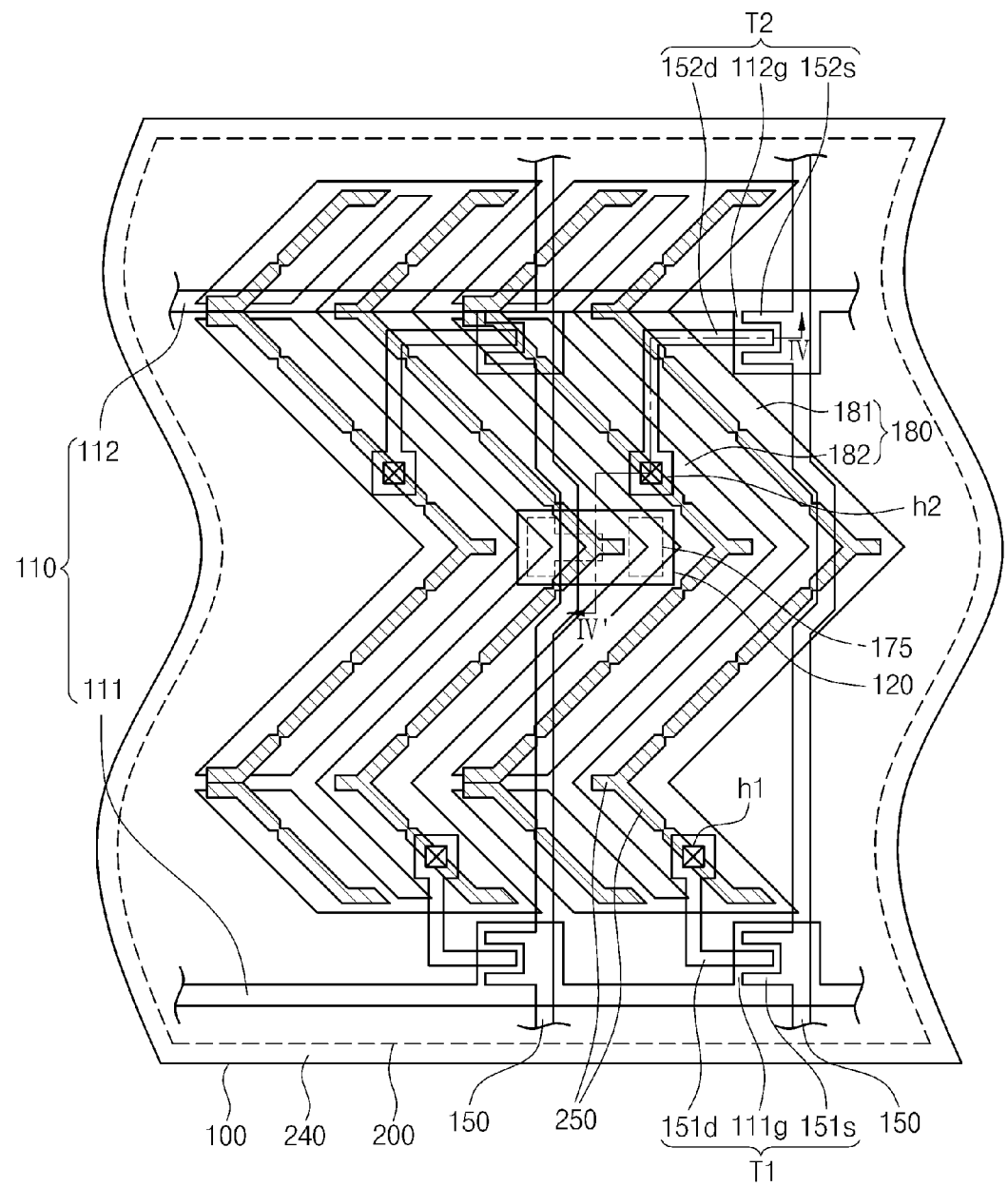
FIG. 9 is a plan view showing a liquid crystal display according to a fourth exemplary embodiment of the present invention.
Figure 10:
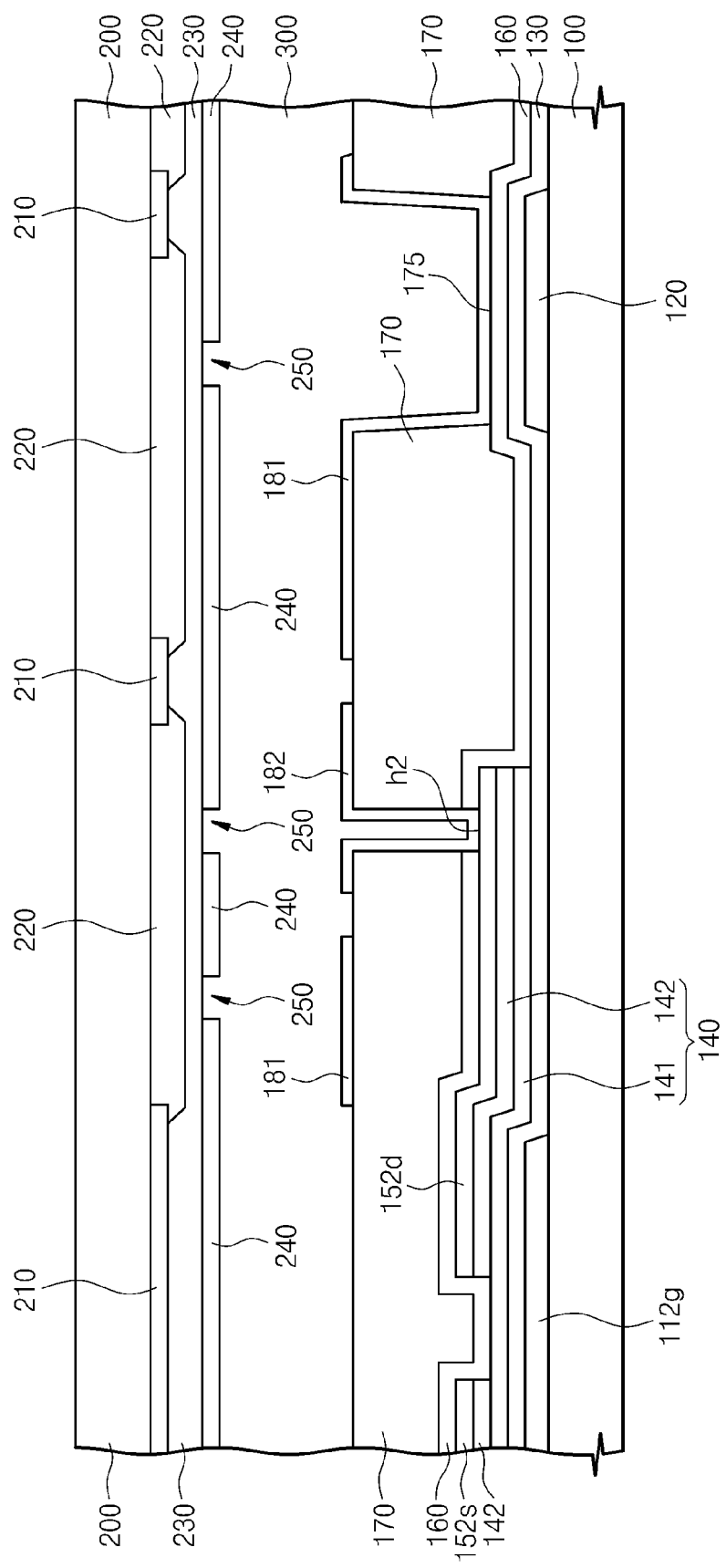
FIG. 10 is a sectional view taken along line IV-IV' of FIG. 9.

FIG. 9 is a plan view showing a liquid crystal display according to a fourth exemplary embodiment of the present invention and FIG. 10 is a sectional view taken along line IV-IV' of FIG. 9.

In the present exemplary embodiment, the same reference numerals are assigned to the same elements as the elements in the first and second exemplary embodiments, and detailed descriptions of the same elements will be omitted below in order to avoid redundancy.

Referring to FIG. 9, a first substrate 100 and a second substrate 200 are provided. A plurality of pixel areas having the same structure is defined on the first substrate 100. Each pixel area is formed with a pixel electrode 180.

The first substrate 100 may include a gate line 110, a data line 150, and the pixel electrode 180. The pixel electrode 180 may include a first pixel electrode 181 and a second pixel electrode 182, which are spaced apart from each other. The gate line 110 may include a first gate line 111 and a second gate line 112.

The first thin film transistor T1 may be formed on the first gate line 111 and the data line 150 and connected to the first pixel electrode 181. The first thin film transistor T1 may include a first gate electrode 111g branched from the first gate line 111, a first source electrode 151s branched from the data line 150, and a first drain electrode 151d connected to the first pixel electrode 181 through a first contact hole h1. The first drain electrode 151d is spaced apart from the first source electrode 151s.

Similarly, the second thin film transistor T2 may be formed on the second gate line 112 and the data line 150 and connected to the second electrode 182. The second thin film transistor T2 may include a second gate electrode 112g branched from the second gate line 112, a source electrode 152s branched from the data line 150, and a second drain electrode 152d connected to the second pixel electrode 182 through the second contact hole h2. The second drain electrode 152d is spaced apart form the second source electrode 152s.

The storage electrode 120 may be formed on the first substrate 100 and spaced apart from the first and second gate electrodes 111g and 112g. The storage electrode 120 may extend over the first and second pixel electrodes 181 and 182. A storage capacitor may be formed in the area where the storage electrode 120 overlaps the pixel electrode 180.

Signals for the operation of the liquid crystal display may be transmitted to the gate line 110 and the data line 150. Data voltages having different intensities may be applied to the first and second pixel electrodes 181 and 182 through the first and second thin film transistors T1 and T2 to display an image. Accordingly, the alignment of the liquid crystals may be changed on the first and second pixel electrodes 181 and 182 and different optical characteristics may be exhibited and compensated for in corresponding areas, so the image quality of the liquid crystal display may be improved.

The pixel electrode 180 may have a symmetrical shape about the longitudinal direction of the gate line 110 and may extend in a zigzag manner. The second substrate 200 may be provided with a common electrode 240 having a domain divider 250. The domain divider 250 may be positioned in the center of the pixel electrode 180. The domain divider 250 may be formed as a cutting pattern by removing a portion of the common electrode 240. The area between the first and second pixel electrodes 181 and 182 in the pixel electrode 180 may be a cutting pattern formed by removing a portion of the pixel electrode 180. Accordingly, the domain divider 250 may interact with the area between the first and second pixel electrodes 181 and 182 to divide the pixel area into a plurality of domains, which may increase the viewing angle of the liquid crystal display.

The domain divider 250 may have a zigzag shape like the pixel electrode 180. If the domain divider 250 extends in the same manner as the pixel electrode 180, the pixel electrodes 180 belonging to neighboring pixel areas may be as close to each other as possible, which may improve the aperture ratio. The domain divider 250 may further include a portion extending in the longitudinal direction of the gate line 110 in addition to the portion extending in a zigzag manner.

Hereinafter, the vertical structure of the liquid crystal display will be described. However, since the first and second thin film transistors T1 and T2 are similar to each other when viewed in the vertical structure, the vertical structure of the second thin film transistor T2 will be representatively described below.

Referring to FIG. 10, the second thin film transistor T2 and the storage capacitor may be formed on the first substrate 100 and may be spaced apart from each other. The second thin film transistor T2 may include a gate electrode 112g, a gate insulating layer 130, a semiconductor pattern 140 having an active pattern 141 and an ohmic contact pattern 142, a source electrode 152s, and a second drain electrode 152d. The second thin film transistor T2 may be covered by the first and second transparent insulating layer patterns 170 and 160, and the pixel electrode 180 may be formed on the first transparent insulating pattern 170.

The second transparent insulating layer pattern 160 may include an inorganic material to protect the second thin film transistor T2. The first transparent insulating pattern 170 may include an organic material and may have a thickness of several micrometers to increase the vertical distance between the data line 150 and the pixel electrode 180, which may prevent coupling of the data line 150 and the pixel electrode 180. The first and second transparent insulating patterns 170 and 160 may be provided with a second contact hole h2 to expose the second drain electrode 152d.

The first transparent insulating layer pattern 170 having the opening 175 may be formed on the storage electrode 120. As shown in FIG. 9, the width of the opening 175 varies. In detail, the width of the opening 175 narrows in an area where the domain divider 250 bends in a zigzag manner. The narrowed width of the opening 175 of the first transparent insulating layer pattern 170 may be uniform. Alternatively, different from FIG. 9, the opening 175 of the first transparent insulating layer pattern 170 may have an irregular width in the area where the width of the opening part 175 narrows. The first transparent insulating layer pattern 170 may cover the storage electrode 120 in the area where the domain divider 250 is formed parallel to the gate line 110.

A light blocking pattern 210, a color filter 220, and an overcoat layer 230 may be formed between the second substrate 200 and the common electrode 240. The light blocking pattern 210 may block the transmission of light that is not controlled by the pixel electrode 180. The color filter 220 may include red, green, and blue color filters corresponding to three primary colors and may display a color image through the combination of the three color filters. The overcoat layer 230 may reduce the step difference between the light blocking pattern 210 and the color filter 220.

FIG. 11A, FIG. 11B, FIG. 11C, FIG. 11D, FIG. 11E, FIG. 11F, FIG. 11G, FIG. 11H, and FIG. 11I are sectional views showing a method of manufacturing the liquid crystal display of FIG. 10 according to an exemplary embodiment of the present invention. Because the first thin film transistor T1 has a structure and a manufacturing process similar to those of the second thin film transistor T2, the detailed description thereof will be omitted.

Figure 11A:
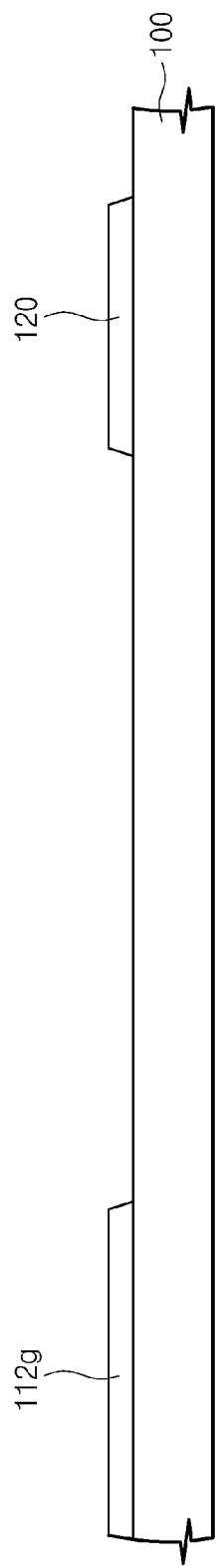

Referring to FIG. 11A, after forming a gate conductive layer on the first substrate 100, the resultant structure may be patterned to form the second gate electrode 112g and the storage electrode 120. The gate conductive layer may be formed by depositing molybdenum (Mo), copper (Cu), aluminum (Al), silver (Ag), or chrome (Cr)-based metal, alloys thereof, or a multi-layer using a combination of these metals. The gate conductive layer may be etched through a wet etching process using etchant or a dry etching process using plasma.

Figure 11B:
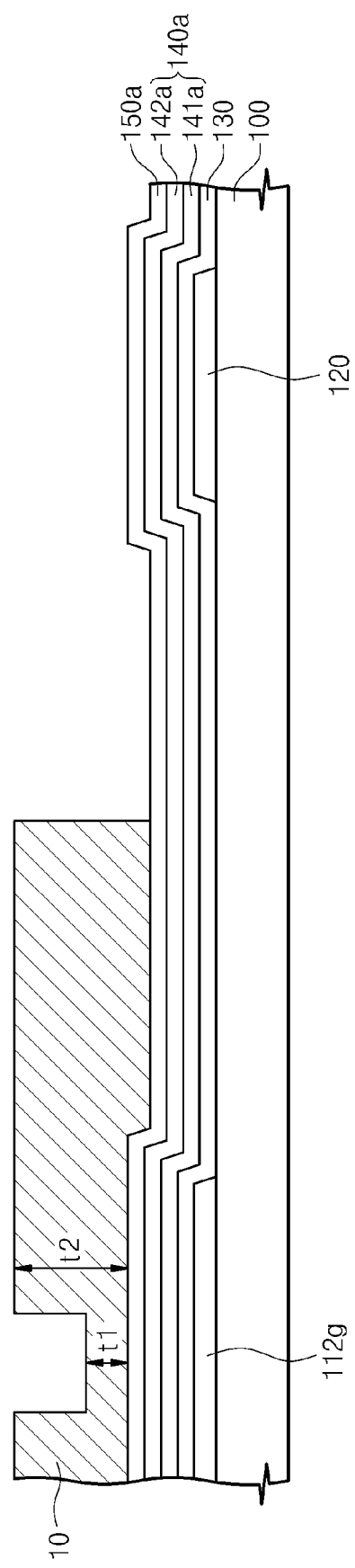

Referring to FIG. 11B, the gate insulating layer 130 may be formed on the second gate electrode 112g and the storage electrode 120. The gate insulating layer 130 may include an inorganic compound, for example, a silicon nitride layer. The semiconductor layer 140a may be formed on the gate insulating layer 130. The semiconductor layer 140a may include an amorphous silicon layer. The semiconductor layer 140a may include an active layer 141a and an ohmic contact layer 142a, which may include impurity ions, formed on the active layer 141a. The gate insulating layer 130 and the semiconductor layer 140a may cover the entire surface of the first substrate 100 through a plasma-enhanced chemical vapor deposition method.

A data conductive layer 150a may be formed on the semiconductor layer 140a. The data conductive layer 150a may be formed similarly to the gate conductive layer. The first photoresist pattern 10 may be formed on the data conductive layer 150a. The first photoresist pattern 10 may be formed by coating a photoresist film on the data conductive layer 150a and then performing an exposure and development process with respect to the resultant structure.

The first photoresist pattern 10 may have different thicknesses according to the position thereof. The first photoresist pattern 10 may have a first thickness t1 in a predetermined area on the second gate electrode 112g, and a second thickness t2 thicker than the first thickness t1 in an area adjacent to the area of the first thickness t1. In addition, the data conductive layer 150a formed on the storage electrode 120 may be exposed by the first photoresist pattern 10.

As described above, in order to provide the first photoresist pattern 10 with different thicknesses according to the areas thereof, a photo mask enabling halftone exposure for the photoresist film may be used. For example, a slit or halftone mask may be used. The slit mask or the halftone mask may include a transmitting part, a non-transmitting part, and an intermediate transmitting part. The intermediate transmitting part of the slit mask may include slits, and the intermediate transmitting part of the halftone mask may include a halftone material.

A portion of light may be transmitted in the intermediate transmitting part by using the slit or the halftone material and the photoresist film may be halftone-exposed. Accordingly, the photoresist pattern may be formed with an intermediate thickness in a portion corresponding to the intermediate transmitting portion. In the present exemplary embodiment, the intermediate thickness corresponds to the first thickness t1.

Figure 11C:
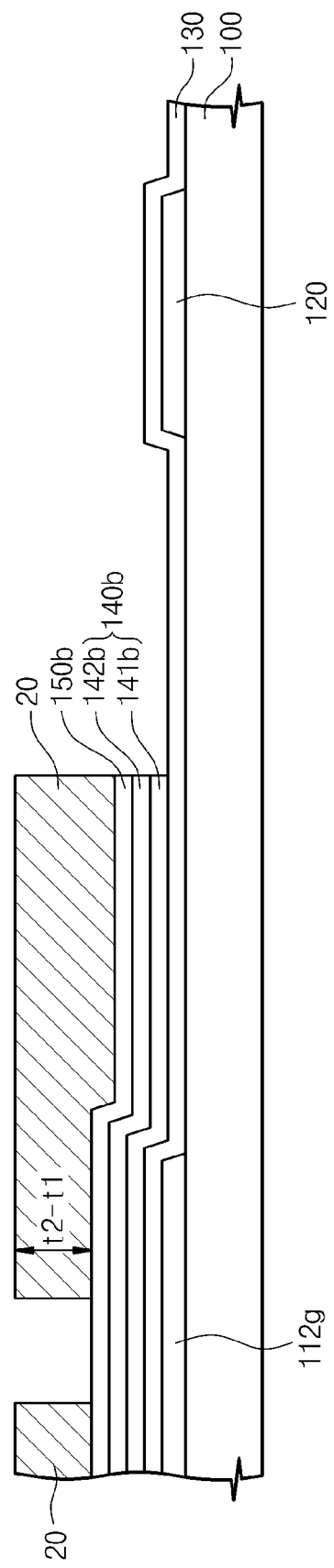

Referring to FIG. 11C, the data conductive layer 150a and the semiconductor layer 140a may be etched using the first photoresist pattern 10 as an etching mask. Through the above etching process, a data conductive layer pattern 150b and a preliminary semiconductor layer pattern 140b may be formed. The preliminary semiconductor layer pattern 140b may include a preliminary active pattern 141b and a preliminary ohmic contact pattern 142b. The preliminary semiconductor layer pattern 140b and the data conductive layer pattern 150b may be formed using the same pattern, such that the preliminary semiconductor layer pattern 140b overlaps the data conductive layer pattern 150b when viewed in a plan view.

The first photoresist pattern 10 may be uniformly removed by the first thickness t1 to form the second photoresist pattern 20. The second photoresist pattern 20 may have a thickness corresponding to the difference between the second thickness t2 and the first thickness t1. The data conductive layer pattern 150b that covers the second gate electrode 112g may be exposed by the second photoresist pattern 20.

Figure 11D:
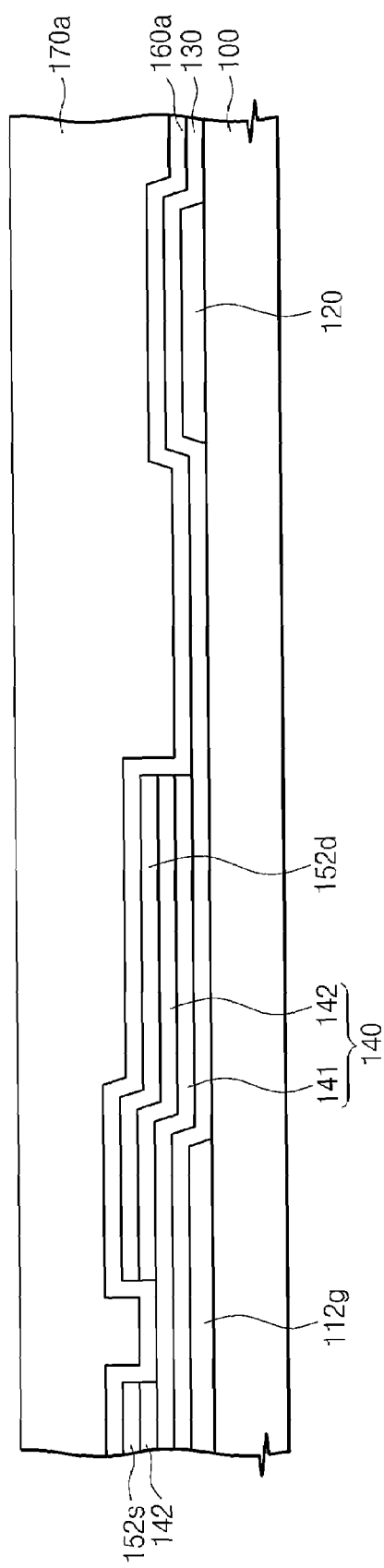

Referring to FIG. 11D, the data conductive layer pattern 150b may be etched using the second photoresist pattern 20 as an etching mask. The data conductive layer pattern 150b may be etched to form the second source electrode 152s and the second drain electrode 152d on the second gate electrode 112g. In addition, the preliminary semiconductor layer pattern 140b may be etched to form the semiconductor layer pattern 140. When the preliminary semiconductor layer pattern 140b is etched, the preliminary semiconductor layer pattern 140b may be divided into two parts to form an ohmic contact pattern 142 and an active pattern 141 at the lower portion of the ohmic contact pattern 142.

As described above, when the second thin film transistor T2 is manufactured, the semiconductor pattern 140, the second source electrode 152s, and the second drain electrode 152d may be formed by using the same photo mask, so that the number of process steps and the manufacturing costs may be reduced.

The first and second transparent insulating layers 170a and 160a may be formed on the second thin film transistor T2. The second transparent insulating layer 160a may be formed similarly to the gate insulating layer 120. The first transparent insulating layer 170a may be formed by coating an organic layer, for example, acrylic resin, on the second transparent insulating layer 160a and then patterning the resultant structure. The first transparent insulating layer 170a may have photosensitivity such that the first transparent insulating layer 170a is subject to an exposure and development process. The photosensitivity may be a positive type or a negative type. Hereinafter, the positive type will be described as an example.

Referring to 11E, the first transparent insulating layer 170a may be exposed using a photo mask 30. The photo mask 30 may include a transmitting part 31, an intermediate transmitting part 32, and a non-transmitting part 33. As described above, the photo mask 30 having the intermediate transmitting part 32 may include a slit mask or a halftone mask.

Figure 12A:
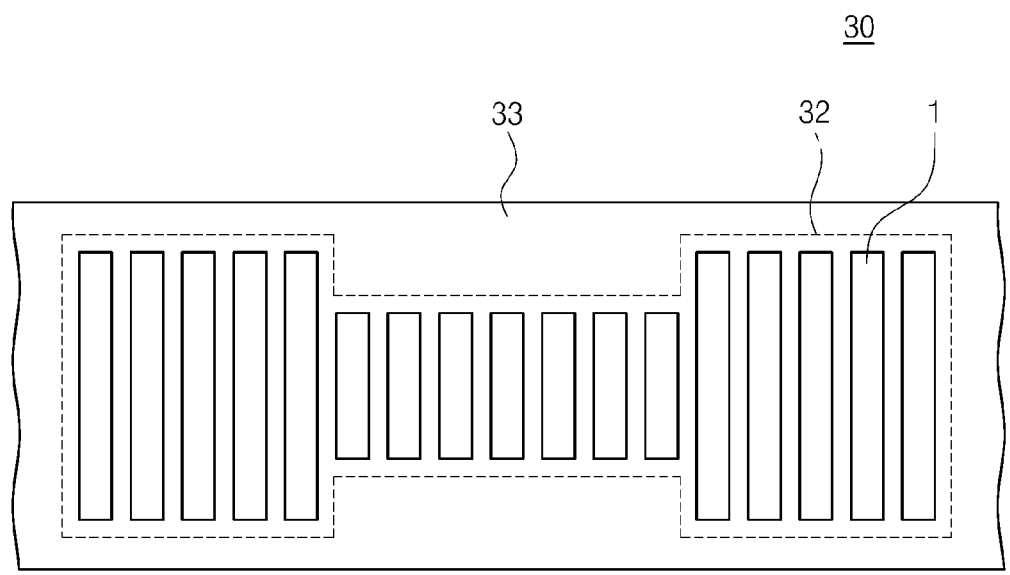
FIG. 12A, FIG. 12B, and FIG. 12C are plan views showing various photo masks used in the exposure process shown in FIG. 11E.
Figure 12B:
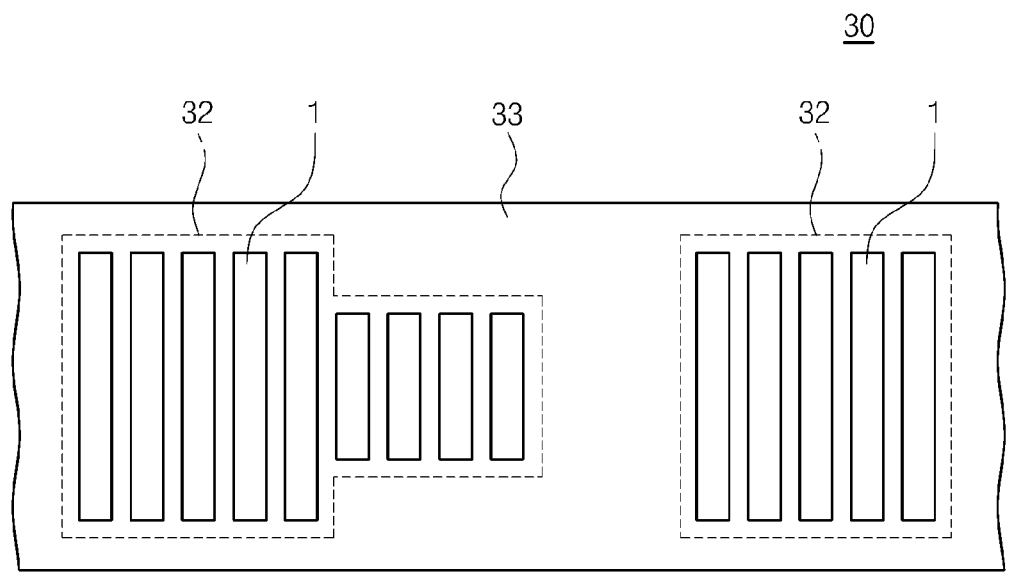
Figure 12C:
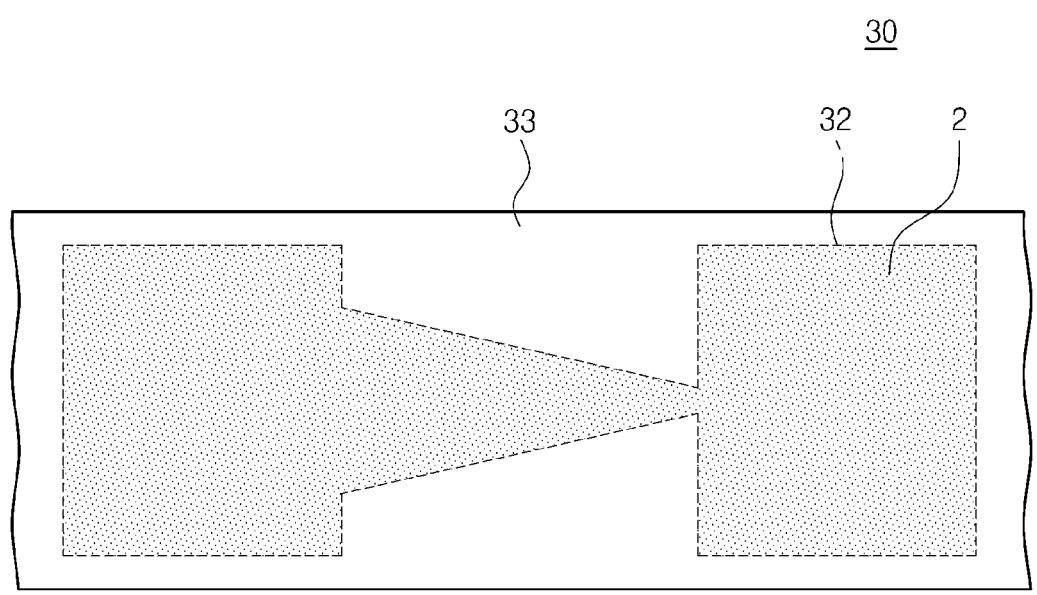

FIG. 12A, FIG. 12B, and FIG. 12C are plan views showing various photo masks used for the exposure process shown in FIG. 11E.

Referring to FIG. 12A, the photo mask 30 includes the intermediate transmitting part 32 and the non-transmitting part 33 adjacent to each other when viewed in a plan view. The intermediate transmitting part 32 includes a plurality of slits 1. The intermediate transmitting part 32 corresponds to the opening 175 of the first transparent insulating pattern 170 on the storage electrode 120 of FIG. 1. The intermediate transmitting part 32 may have a varying width according to the width of the opening 175. A portion of the intermediate transmitting part 32 corresponding to a portion of the opening 175 in the first transparent insulating layer pattern 170 that has a narrowed width may have a narrowed width. For example, when the liquid crystal display shown in FIG. 1 is manufactured, the portion of the transparent insulating layer pattern 170 having the narrower width corresponds to the area where the domain divider 250 is bent.

Referring to FIG. 12B, the photo mask 30 may have an intermediate transmitting part 32 and a non-transmitting part 33 that are adjacent to each other when viewed in a plan view. The intermediate transmitting part 32 may include a plurality of slits 1 and may be divided into a dual-width part and a single-width part. The divided part of the intermediate transmitting part 32 corresponds to a portion of the first transparent insulating layer pattern 170 that covers the storage electrode 120. For example, when the liquid crystal display shown in FIG. 6 is manufactured, the divided part may correspond to an area covering the portion of the domain divider 250 extending in the longitudinal direction of the gate line 110.

Referring to FIG. 12C, the photo mask 30 including the intermediate transmitting part 32 may have a halftone material 2. The intermediate transmitting part 32 may be divided into a portion having a uniform width and a portion having an irregular width narrower than the uniform width. The portion of the intermediate transmitting part 32 having the narrower width may correspond to a portion of the opening 175 in the first transparent insulating layer pattern 170 having a narrower width. For example, when the liquid crystal display shown in FIG. 8 is manufactured, the portion having the narrower width may correspond to the area where the domain divider 250 is bent. The portion having the narrower width may narrow as the portion having the narrower width approaches the area where the domain divider is bent.

As shown in FIG. 12A, FIG. 12B, and FIG. 12C, the photo mask 30 may have various shapes. In other words, the photo mask 30 may include a dual-width part of the intermediate transmitting part 32. Accordingly, the shape of the opening 175 in the first transparent insulating pattern 170 may correspond to the shape of the intermediate transmitting part 32.

Figure 11F:
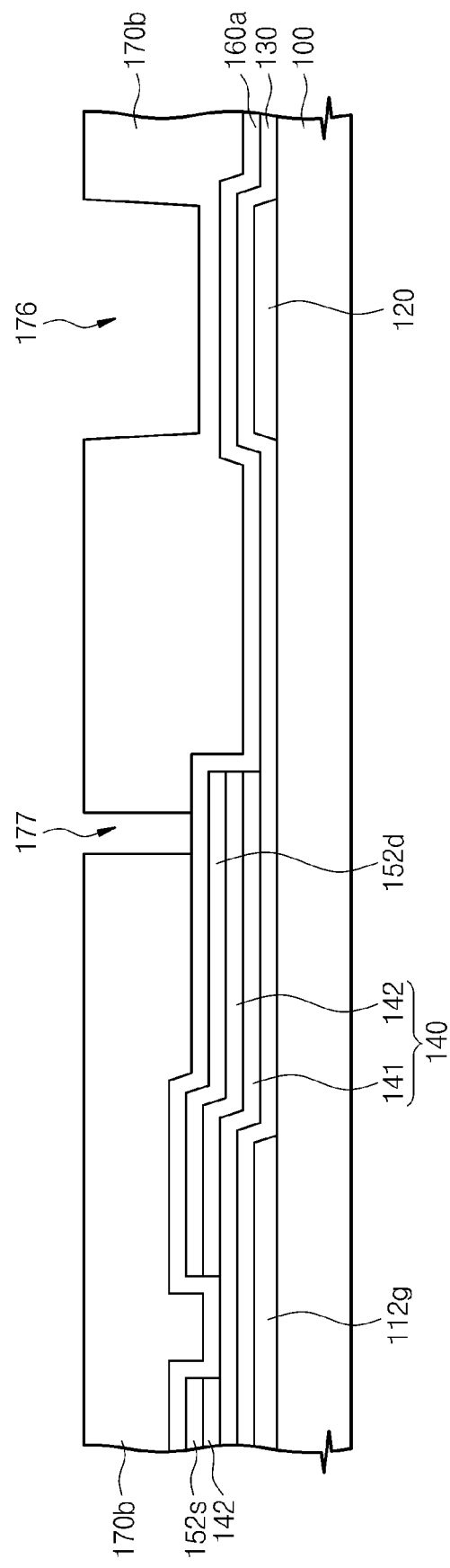

Referring to FIG. 11F, the exposed first transparent insulating layer 170a may be developed to form the preliminary first transparent insulating layer pattern 170b. The transmitting part 31 may correspond to a predetermined area on the second drain electrode 152d and the whole thickness of the first transparent insulating layer 170a may be removed in the area to form the contact hole 177. The intermediate transmitting part 32 may correspond to a predetermined area on the storage electrode 120 and a predetermined thickness of the first transparent insulating layer 170a may be removed in the area.

Referring to FIG. 11G, the preliminary first transparent insulating layer pattern 170b and the second transparent insulating layer 160a may be etched. A portion of the preliminary first transparent insulating layer pattern 170b corresponding to the intermediate transmitting part 32 may be removed. Then the second transparent insulating layer 160a may be etched such that the second drain electrode 152d is exposed. Accordingly, the first and second transparent insulating layer patterns 170 and 160 may be formed. The opening 175 in the first transparent insulating layer pattern 170 may correspond to the intermediate transmitting part 32. The first and second transparent insulating layer patterns 170 and 160 may be provided with a second contact hole h2 formed therethrough to expose the second drain electrode 152d.

A transparent conductive layer may be formed on the first transparent insulating layer pattern 170. The transparent conductive layer may be formed through a sputtering deposition process using indium zinc oxide (IZO) or indium tin oxide (ITO). Then, the transparent conductive layer may be etched to form the pixel electrode 180.

A manufacturing process of the first substrate 100 is described above. Although the second thin film transistor T2 is representatively described through the manufacturing process, the same manufacturing process may be employed for the first thin film transistor T1.

Figure 11H:
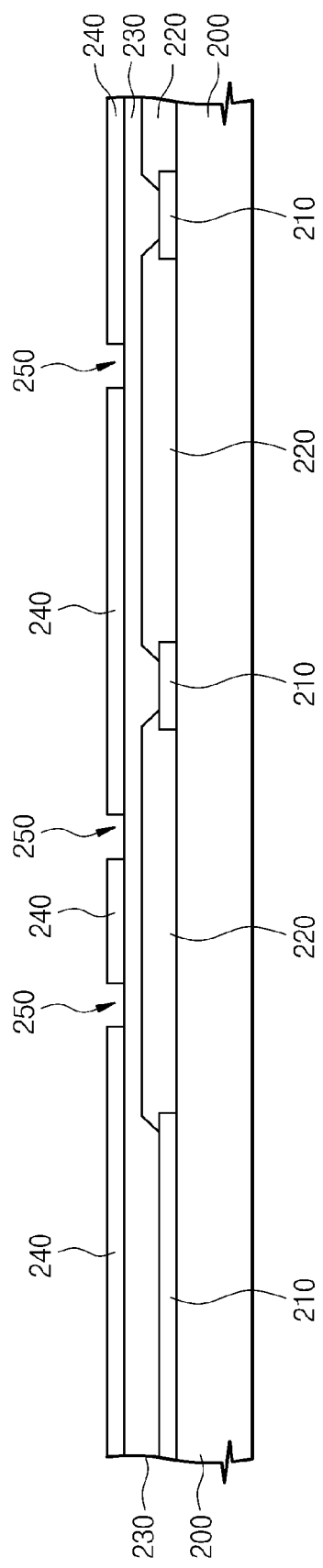

Referring to FIG. 11H, the second substrate 200 may be manufactured independently from the first substrate 100. After forming a light blocking layer on the second substrate 200, the resultant structure may be patterned to form the light blocking layer pattern 210. After forming a photoresist film having a color on the light blocking layer pattern 210, the resultant structure may be patterned to form the color filter 220. Acrylic resin may be coated on the color filter 220 to form the overcoat layer 230. The transparent conductive layer may be formed on the overcoat layer 230, and the transparent conductive layer may be patterned to form the common electrode 240 having the domain divider 250.

Figure 11I:
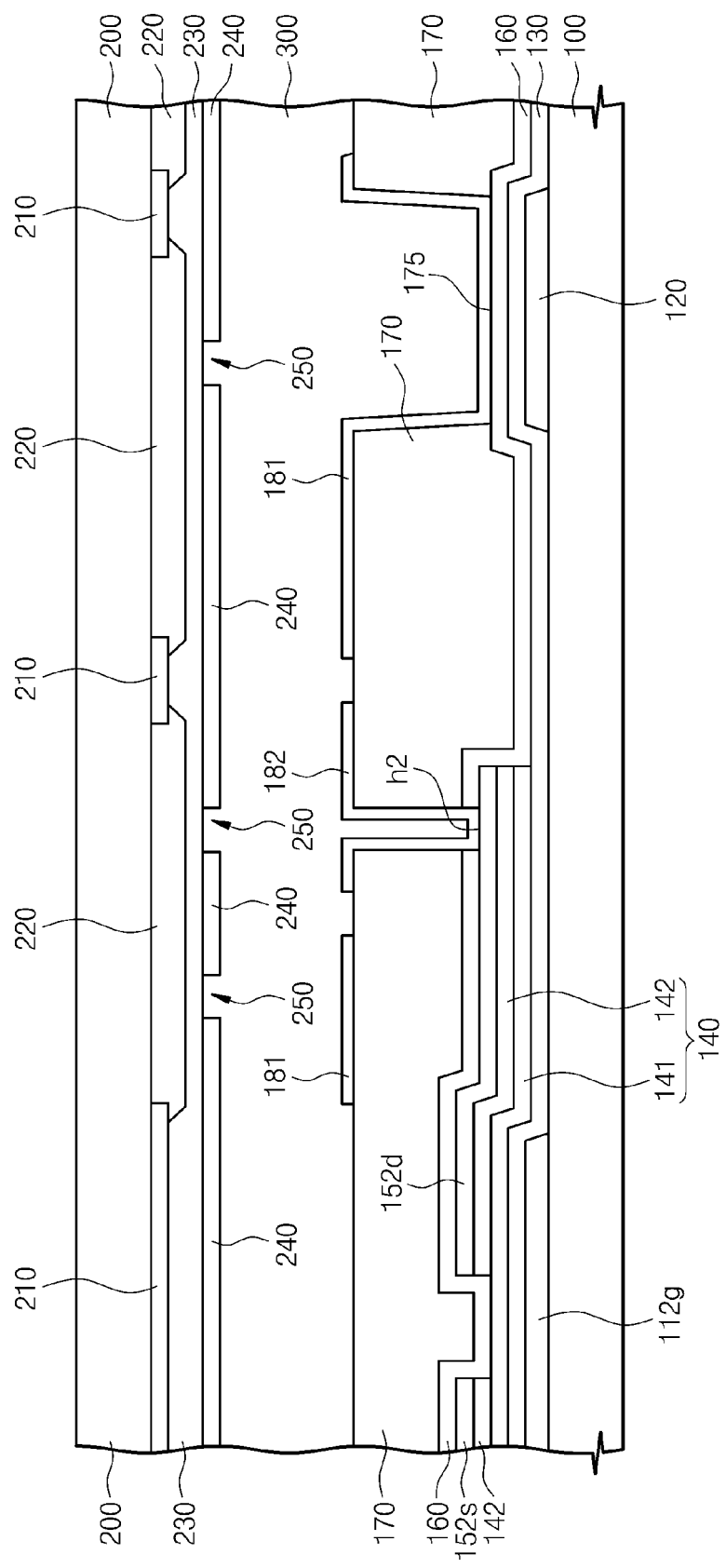

Referring to FIG. 11I, the first and second substrates 100 and 200 may be coupled with each other while facing each other. The liquid crystal layer 300 may be formed between the first and second substrates 100 and 200. The liquid crystal layer 300 may be formed by injecting liquid crystals between the first and second substrates 100 and 200 or dropping liquid crystals on one of the first and second substrates 100 and 200.

As described above, the viewing angle of the liquid crystal display may be widened and the alignment direction of the liquid crystals may be desirably controlled, which may allow a high-quality image to be displayed.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display, comprising:
    a first substrate comprising a pixel area defined thereon;
    a second substrate facing the first substrate;
    a liquid crystal layer interposed between the first substrate and the second substrate;
    a storage electrode disposed on the first substrate;
    a first transparent insulating layer pattern disposed on the storage electrode, the first transparent insulating layer pattern comprising an opening having a first area having a first width and a second area having a second width narrower than the first width;
    a pixel electrode disposed on the first transparent insulating layer pattern; and
    a common electrode disposed on the second substrate, the common electrode comprising a domain divider that divides the pixel area into a plurality of domains, the domain divider partially overlapping the storage electrode in the second area of the opening of the first transparent insulating layer.

2. The liquid crystal display of claim 1, wherein the opening in the first transparent insulating layer pattern is entirely within the perimeter of the storage electrode.

3. The liquid crystal display of claim 1, wherein the domain divider comprises:
    a first part extending in a first direction inclined with respect to a longitudinal direction of the storage electrode; and
    a second part extending in a second direction symmetrical to the first direction about the longitudinal direction of the storage electrode,
    wherein an end portion of the first part meets an end portion of the second part in an area where the storage electrode is disposed.

4. The liquid crystal display of claim 3, wherein the second area of opening in the first transparent insulating layer pattern is in the area where the end portion of the first part meets with the end portion of the second part.

5. The liquid crystal display of claim 4, wherein the second width gradually decreases toward the area where the end portion of the first part meets the end portion of the second part.

6. The liquid crystal display of claim 3, wherein the domain divider further comprises a third part that is substantially parallel to the longitudinal direction of the storage electrode and has an end portion meeting with the end portions of the first part and the second part.

7. The liquid crystal display of claim 6, wherein the first transparent insulating layer pattern partially covers the third part.

8. The liquid crystal display of claim 3, wherein the pixel electrode extends along the first direction and the second direction, and the domain divider is positioned at a center of the pixel electrode.

9. The liquid crystal display of claim 3, wherein the domain divider has at least one notch spaced apart from the storage electrode.

10. The liquid crystal display of claim 9, wherein the notch is spaced apart from the second area of the opening of the first transparent insulating layer pattern by a distance of at least 20 µm along a direction in which the domain divider extends.

11. The liquid crystal display of claim 1, further comprising a thin film transistor disposed between the first substrate and the pixel electrode,
    wherein the thin film transistor comprises:
    a gate electrode disposed on the first substrate and spaced apart from the storage electrode;
    an active pattern disposed on the gate electrode;
    an ohmic contact pattern disposed on the active pattern and overlapping the active pattern except in a channel area; and a source electrode and a drain electrode on the ohmic contact pattern, the source electrode and the drain electrode overlapping the ohmic contact pattern.

12. The liquid crystal display of claim 11, further comprising a second transparent insulating layer pattern interposed between the storage electrode and the first transparent insulating layer pattern and covering the storage electrode, wherein the first transparent insulating layer pattern and the second transparent insulating layer pattern comprise a contact hole through which the pixel electrode is connected to the drain electrode.

13. The liquid crystal display of claim 12, wherein the first transparent insulating layer pattern is thicker than the second transparent insulating layer pattern, and the first transparent insulating layer pattern and the second transparent insulating layer pattern comprise an organic material and an inorganic material, respectively.

14. The liquid crystal display of claim 1, wherein the domain divider comprises a cutting pattern of the common electrode or a protrusion formed on the common electrode.

* * * * *